United States Patent
Boitard et al.

(10) Patent No.: US 10,872,663 B2
(45) Date of Patent: Dec. 22, 2020

(54) DATA STORAGE MANAGEMENT IN A DEVICE INCLUDING REMOVABLE AND EMBEDDED STORAGE AREAS

(71) Applicant: NXP B.V., Eindhoven (NL)

(72) Inventors: Fabien Boitard, Mouans Sartoux (FR); Ludovic Oddoart, Nice (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/516,900

(22) Filed: Jul. 19, 2019

(65) Prior Publication Data

US 2020/0357465 A1    Nov. 12, 2020

(30) Foreign Application Priority Data

May 10, 2019  (EP) .................... 19305599

(51) Int. Cl.
*G11C 13/00* (2006.01)
*G06K 19/07* (2006.01)
*G06K 7/10* (2006.01)

(52) U.S. Cl.
CPC ...... *G11C 13/0069* (2013.01); *G06K 7/10237* (2013.01); *G06K 19/072* (2013.01); *G11C 13/0097* (2013.01)

(58) Field of Classification Search
None
See application file for complete search history.

(56) References Cited

U.S. PATENT DOCUMENTS

| | | | |
|---|---|---|---|
| 2012/0172016 A1* | 7/2012 | Veneroso | H04W 12/0608 455/414.1 |
| 2012/0190354 A1* | 7/2012 | Merrien | H04L 63/083 455/422.1 |
| 2013/0023309 A1* | 1/2013 | Holtmanns | H04W 4/60 455/558 |
| 2013/0165073 A1 | 6/2013 | Madsen | |
| 2015/0382178 A1 | 12/2015 | Park et al. | |
| 2017/0142159 A1* | 5/2017 | Li | H04B 5/0031 |
| 2018/0270112 A1* | 9/2018 | Hiranniah | H04L 41/0806 |
| 2018/0359629 A1* | 12/2018 | Manam | H04W 8/245 |
| 2019/0098487 A1* | 3/2019 | Boettger | H04W 76/15 |

FOREIGN PATENT DOCUMENTS

| | | |
|---|---|---|
| CN | 106611608 B | 1/2019 |
| EP | 3413600 A1 | 12/2018 |
| WO | WO-2018/048278 A1 | 3/2018 |

* cited by examiner

Primary Examiner — J. H. Hur

(57) ABSTRACT

A device includes a first signal line, a second signal line, and a controller. The first signal line is coupled to a first storage area. The second signal line is coupled to a second storage area. The controller outputs a signal to the first signal line or the second signal line to select the first storage area or the second storage area. The first storage area may be a removable data storage card, and the second storage area may be an embedded storage area in the device. The signal is a reset signal for the selected one of the first storage area and the second storage area.

18 Claims, 3 Drawing Sheets

DATA STORAGE MANAGEMENT IN A DEVICE INCLUDING REMOVABLE AND EMBEDDED STORAGE AREAS

This application is based upon and claims the benefit of priority from prior European Patent Application No. 19305599.3, filed May 10, 2019, which is hereby incorporated by reference for all purposes as if fully set forth herein.

TECHNICAL FIELD

Example embodiments disclosed herein relate to managing data storage.

BACKGROUND

Smartphones and other mobile devices are designed with ever increasing functionality, but not without drawbacks. For example, increasing functionality increases the numbers and sizes of chips and their supporting connections. This stands as an impediment to reducing the size of the device.

One example of the increased functionality of smartphones is the use of near-field communications (NFC) to transmit/receive data with external devices. The data may include, for example, subscriber account and identification information, phone numbers, credit card numbers, and various types of control information. This data is stored in a subscriber identity module (SIM) card that is removably inserted into a slot of the smartphone. An example of one type of SIM card is a universal integrated circuit card (UICC).

Use of a removable SIM card in a smartphone is not always desirable. For example, the data stored on such a card may be accessed by an unauthorized user if the smartphone is lost or stolen. One attempt to solve this problem involves using an embedded SIM storage and a removable SIM card in the same smartphone. However, this approach has been implemented in a manner that requires the use of external switches to select the embedded SIM storage or the removable SIM card. These external switches consume valuable board space and consume significant power.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

In accordance with one or more embodiments, a device includes a first signal line coupled to a first storage area, a second signal line coupled to a second storage area, and a controller configured to output a signal to the first signal line or the second signal line to select the first storage area or the second storage area, wherein the first storage area is a removable data storage card and the second storage area is an embedded storage area in the device and wherein the signal is a reset signal for the selected one of the first storage area and the second storage area. The removable data storage card may be a universal integrated circuit card (UICC), and the embedded storage area may be an embedded universal integrated circuit card (eUICC). The device may include a circuit on a chip, wherein the eUICC is on the chip and the chip is coupled to the UICC. The circuit may be a near-field communications (NFC) circuit which reads data from or stores data to the selected one of the UICC and the eUICC. The device may include a single wire protocol (SWP) line coupled between the chip and the UICC, wherein the NFC circuit communicates with the UICC through the SWP line when the UICC is selected. The device may include a third signal line to carry a clock signal to the controller, the removable data storage card, and the embedded storage area.

The device may include a third signal line coupled to the controller, the removable data storage card, and the embedded storage area, wherein the third signal line is a bidirectional input/output line to carry data. The controller may output signals to the first signal line and the second signal line independently from one another. The controller may automatically output the signal to the first signal line or the second signal line based on an instruction stored in a memory. The controller may output the signal to the first signal line or the second signal line based on a user input signal.

In accordance with one or more embodiments, a method for managing data storage includes receiving an instruction to select a first storage area or a second storage area, generating a reset signal, and transmitting the reset signal to a first signal line coupled to the first storage area or a second signal line coupled to the second storage area, wherein the first storage area is a removable data storage card and the second storage area is an embedded data storage area and wherein the removable data storage card and the embedded data storage are located in a same device. The removable data storage card may be a universal integrated circuit card (UICC) and the embedded storage area may be an embedded universal integrated circuit card (eUICC). The eUICC may be on a same chip as a circuit. The circuit may be a near-field communications (NFC) circuit which reads data from or stores data to the selected one of the UICC and the eUICC. The method may include transmitting a clock signal along a third signal line commonly coupled to the controller, the removable data storage card, and the embedded storage area. The method may include transmitting data along a third signal line commonly coupled to the controller, the removable data storage card, and the embedded storage area.

In accordance with one or more embodiments, a non-transitory machine-readable medium stores instructions to cause a processor to receive an instruction to select a first storage area or a second storage area, generate a reset signal, and transmit the reset signal to a first signal line coupled to the first storage area or a second signal line coupled to the second storage area, wherein the first storage area is a removable data storage card and the second storage area is an embedded data storage area and wherein the removable data storage card and the embedded data storage are located in a same device. The removable data storage card may be a universal integrated circuit card (UICC), and the embedded storage area may be an embedded universal integrated circuit card (eUICC). The eUICC may be on a same chip as a circuit, and the circuit may be a near-field communications (NFC) circuit which reads data from or stores data to the selected one of the UICC and the eUICC.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1:
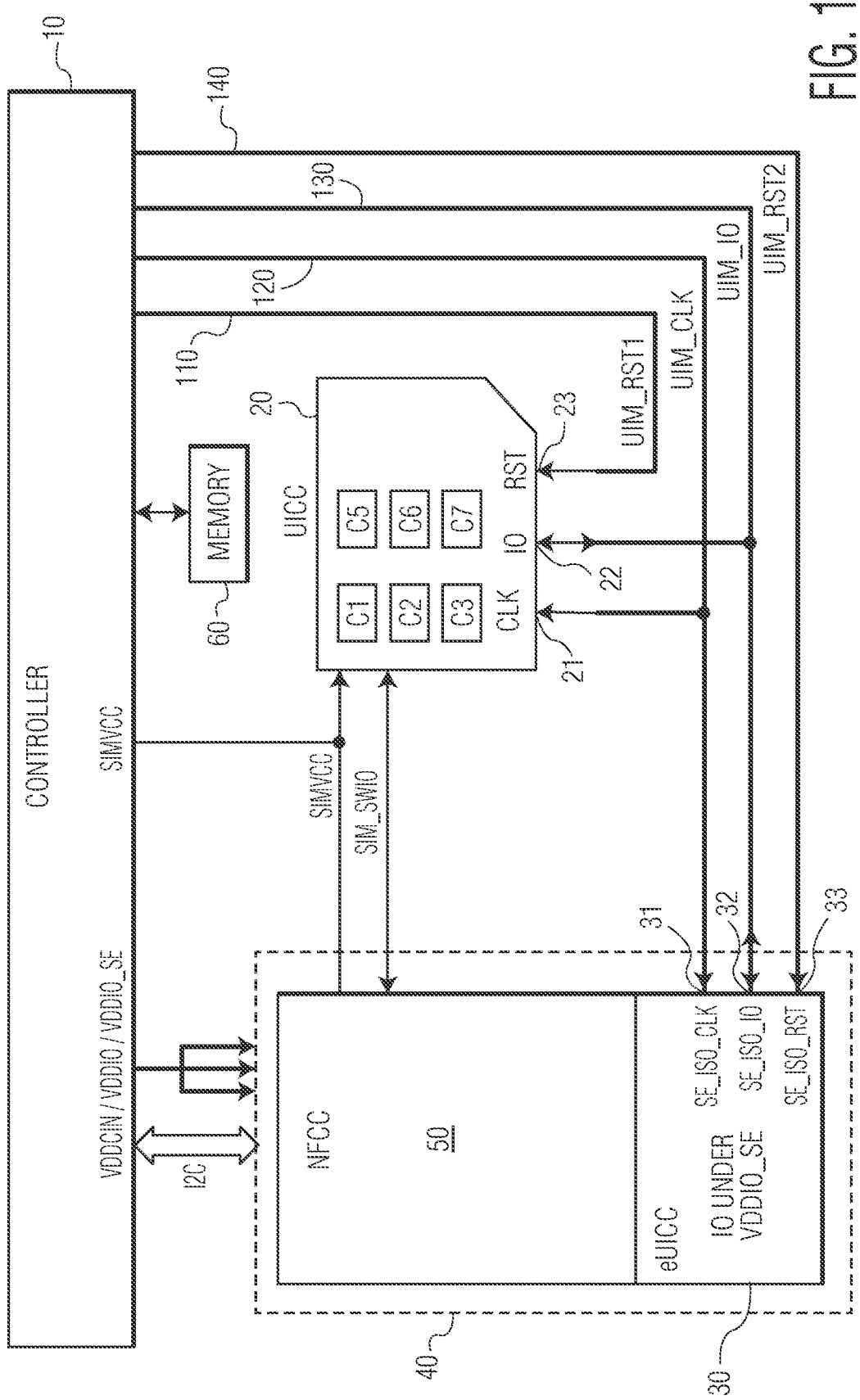
FIG. 1 illustrates an embodiment of a system for managing data storage in a device.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

FIG. 1 illustrates an embodiment of a system for managing a plurality of data storage areas in an electronic device. The data storage areas may be managed to exchange data (e.g., read, write, or both) between themselves and/or with one or more circuits or applications. The electronic device may be, for example, a mobile device such as a smartphone, tablet, personal digital assistant, media player, notebook computer, Internet of Things (IoT) device, or another type of information or processing terminal. For illustrative purposes, the electronic device may be referred to as a host device.

Referring to FIG. 1, the system includes a controller 10 of the host device which manages a first data storage area 20 and a second data storage area 30. In one embodiment, the first data storage area may be a removable subscriber identity module (SIM) card and the second data storage area may be an embedded SIM storage area. In one embodiment, the SIM card 20 may be a universal integrated circuit card (UICC) and the embedded SIM storage area 30 may be an embedded UICC (eUICC). Also, the UICC may be Class B storage and the eUICC may be 3V tolerant.

One or more of the storage areas 20 and 30 may be a different type of SIM or storage area in another embodiment. For illustrative purposes, the first storage area 20 may be referred to as a UICC and the second storage area 30 may be referred to as an eUICC.

The UICC 20 may include a plurality of contacts (or pins) C for sending and/or receiving power, control, and data signals. For example, the C1 contact may receive a supply voltage (SIMVCC) from the controller 10 or a power supply of the host device. The supply voltage may activate the UICC and then provide power for performing various operations in association with the controller or other circuits of the host device. The supply voltage received through contact C1 may be in different ranges to support different modes or operation, e.g., normal mode, low-power mode, etc. The contact C2 may receive a reset signal from the controller 10 or another circuit. The contact C3 may receive a clock signal from the controller 10 or another timing circuit. The contact C5 may be a connection to a reference potential, e.g., ground. The contact C6 may be a variable voltage pin to be used for programming and/or to support single wire protocol (SWP) communications, as will be discussed in greater detail below. The contact C7 may be an input/output (I/O) contact for sending and/or receiving data based on a predetermined protocol.

The UICC 20 may include one or more other contacts (or pins) C4 and C8, which are either not used or used for an application-specific purpose. The pin 21 for the clock signal, the pin 22 for the I/O data 22, and the pin 23 for the reset signal 23 are illustrated as inputs in FIG. 1 and are discussed below in connection with operations performed by the controller 10.

The eUICC 30 may include a plurality of pins including, but not limited to, a clock input pin 31, an input/output (I/O) pin 32, and a reset pin 33. The eUICC 30 may include other pins or inputs in accordance with one or more specifications or standards, but pins 31, 32, and 33 are discussed in relation to one or more embodiments. The eUICC is embedded in the sense that is integrated into a chip including one or more other circuits.

In one embodiment, the eUICC 30 may be integrated into a chip 40 which includes a near-field communications (NFC) circuit 50 for communicating signals between the electronic system and an external device. The signals may include personal data, financial data, identification, and/or other data to be transmitted between the NFC circuit 50 and controller 10 or another circuit or application of the host device. These signals may also be transmitted between the NFC circuit 50 and an external device using an antenna coupled to a near-field communications link, for example, for purposes of making a wireless payment (e.g., using a wallet application), conveying identification information, or for another purpose. The chip 40 may also include an embedded secure element (SE) for making secure the communications performed by the NFC circuit 50.

In one embodiment, the eUICC 30 may store one or more applications for purposes of controlling the operations of the NFC circuit 50. In this case, the eUICC 30 may also serve as the secure element (SE). The UICC 20 may also store applications for controlling one or more operations of the host device. The UICC 20 and the eUICC 30, and indeed the entire chip 40, may conform to one more standards, e.g., Global System for Mobile (GSM) communications standard. The NFC circuit 50 and the eUICC 30 are connected by internal signal lines on the chip 40. The internal signal lines may include power, data (I/O), and/or control lines to be used in sending and receiving data from the NFC circuit 50 and/or the controller of the host device. In one embodiment, the UICC 20 and the eUICC 30 may exchange data through one or more signal lines under control of the controller 10, for example, through signal line compatible with an ISO protocol coupled between UICC 20 and the chip 40 or through one or more other signal lines of the host device, e.g., I/O line(s) coupled to the host controller. The ISO protocol line may be a single wire protocol (SWP) line. In some embodiments, communication among the UICC, eUICC, and/or controller 10 may be performed through ISO ports. When ISO port(s) are not used, then a high impedance (HiZ) mode may be implemented so as not to disturb the active link.

The controller 10 performs a plurality of power and management operations for the UICC 20 and the eUICC 30 and the NFC circuit 50 of the chip. The controller 10 may perform these operations, for example, based on instructions (e.g., firmware) stored in a memory 60 of the host device. This memory may be any type of fixed or removable storage.

The power management operations performed by controller 10 include providing power (e.g., SIMVCC) to one or both of the UICC 20 and the chip 40. In one embodiment, the UICC 20 may receive power from the chip 40, based on power which the chip receives from the controller 10. In one embodiment, a voltage source different from the controller may provide power to the UICC 20 and/or the circuits of chip 40.

The management operations performed by the controller 10 include selecting which of the two data storage areas is to be used for operation with the host device, and/or for performing a particular operation involving the host device. The selection is made based on signals transmitted by the controller 10 to respective ones of the UICC 20 and eUICC 30.

As illustrated in FIG. 1, the signals may be transmitted along signal lines 110, 120, 130, and 140. Signal line 110 carries a reset signal (UIM_RST1) from the controller 10 to the reset input pin 23 of the UICC 20. The other signal lines may be connected to the UICC 20 and the eUICC 30. For example, signal line 120 carries a clock signal (UIM_CLK) to the input pin 21 of the UICC 20 and to the input pin 31 (SE_ISO_CLK) of the eUICC 30. The signal line 130 carries data (UIM_IO) between the controller 10 and the pin 22 of the UICC 20 and the controller 10 and the pin (SE_ISO_IO) 32 of the eUICC 30. As indicated by the bidirectional arrows, the signal line 130 may be a bidirectional line for reading data from the UICC and the eUICC and for writing (or storing) data to the UICC and the eUICC.

Thus, in the embodiment of FIG. 1, the clock and I/O signal lines are merged so that only one clock signal line and only one I/O line is used among all three of the controller 10, the UICC 20, and the eUICC 30. By using only one signal line for the clock signal and only one signal line to perform I/O data transfers, the number of signal lines in the host device may be substantially reduced, which leads to a simpler, more space-efficient design and significant power and cost savings.

Also, in the embodiment of FIG. 1, a first reset signal line 110 is used for the UICC 20 and a second, separate signal line 140 is used for the eUICC 30. The controller may use these separate reset signal lines to independently select the UICC and eUICC to perform one or more operations or applications, as determined, for example, by the firmware stored in memory 60. In order to select the UICC 20 or eUICC 30 (for use with the NFC circuit 50 or another application of the host device), the controller 10 outputs a reset signal to the reset pin of the one to be selected. When the controller 10 outputs a reset signal to signal line 110, the UICC 20 is selected. When the controller 10 outputs a reset signal to signal line 140, the eUICC 30 is selected. The firmware stored in memory 60 may instruct the controller 10 to use the selected one of the UICC 20 or the eUICC to which the reset signal was sent, either for all operations of the host device to the exclusion of the unselected storage or for specific operations as determined, for example, by the firmware or a user input or preference. When a reset signal is received by the UICC or the eUICC, an initialization procedure may be implemented, which may involve erasing all data previously stored therein. As a result, the full capacity of the selected data storage may be available for use for subsequent operations of the host device, the NFC circuit, and/or other applications or circuits.

The controller 10 may output a reset signal to signal line 110 or signal line 140 based on one or more scenarios. In one embodiment, the controller may automatically output a reset signal to select one of UICC 20 or eUICC 30 based on instructions in the firmware stored in memory 60. In one embodiment, the firmware may be written to designate the UICC or the eUICC as a default storage area for use with the NFC circuit 50 and/or one or more other applications or circuits upon initial start-up of the host device, when the host device is re-configured or reset, and/or based on one or more other conditions.

Another example may follow a recent trend among smartphone manufacturers who have a preference for using an embedded SIM over a removable SIM card. In the event that the host device has both UICC 20 and eUICC 30, the controller may automatically output a reset signal to the eUICC 30, e.g., when initiated or at start-up. At any time thereafter, for example, based on instructions in the firmware or an application, the UICC may be selected when the controller 10 outputs a reset signal along line 110.

In another example, the controller 10 may output a reset signal to select one of the UICC or the eUICC based on an input signal. The user input signal may be generated, for example, by a user accessing an option in a control menu of the host device. The control menu may be included, for example, in the settings of the host device in order to allow the user to select which storage area (UICC or eUICC) is to be used to store contacts, personal identification information, financial information, and/or other information during use of the host device. For example, while use of the eUICC may be preferred by a smartphone manufacturer, the user of the host device may prefer using the UICC because of its ability to be removed from a slot in the host device for purposes of initializing a new user or host device or otherwise for protecting unauthorized access to sensitive information.

Figure 2A:
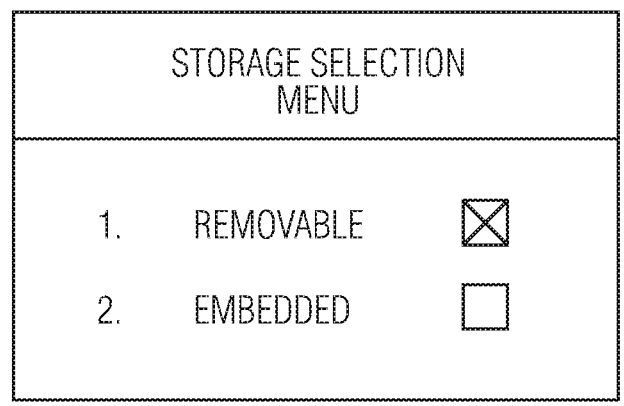
FIGS. 2A and 2B illustrate examples of a user interfaces for selecting data storage devices.

FIG. 2A illustrates an example of user interface that may be displayed on the host device to allow a user to manually select use of removable UICC card 20 or embedded eUICC 30. The controller 10 of the host device may then output a reset signal on the appropriate one of signal lines 110 or 140 to make the selection. The selection may be changed at any time to match the preferences of the user or based on instructions in the firmware or an application implemented on the host device. The user interface may be included in the settings of the user device or may be generated, for example, when a new application is to be executed in the host device.

Figure 2B:
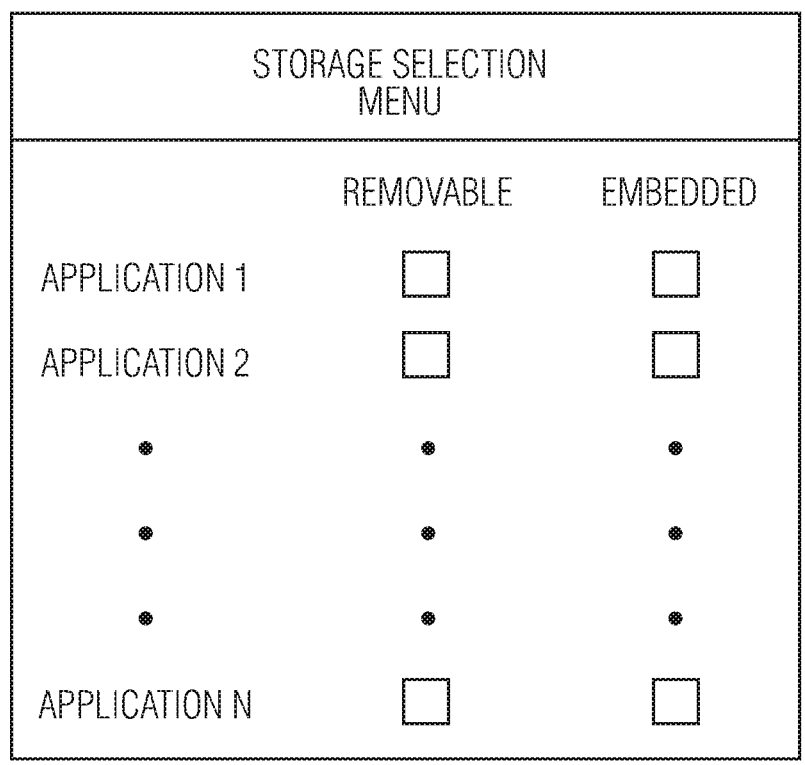

FIG. 2B illustrates an example of an interface that may be displayed to allow the user to select which applications are to be used with the UICC and which applications are to be used with the eUICC. In one embodiment, a user interface may allow the user to select one of the UICC or eUICC as default storage. In one embodiment, the firmware may be written to automatically select the UICC for some applications and the eUICC for other applications, by outputting a reset signal along a corresponding one of the signal lines 110 or 140. In one embodiment, resetting one of the UICC or eUICC may disable operation of the unselected one of the UICC or eUICC.

In one embodiment, the eUICC 30 may perform a data input/output operation based on voltage from a power supply VDDIO_SE output from the controller 10. The controller 10 may also output different levels of voltage (see the branch paths in FIG. 1) from a power supply VDDIO to support data input/output operations performed by the NFC circuit 50, either relative to the UICC 20 or the eUICC 30. The controller 10 and the chip 40 may communicate data, control signals, and/or other information over a bus (e.g., Inter-Integrated Circuit (I2C) bus).

In one embodiment, the UICC 20 and the eUICC 30 may perform concurrent operations (e.g., may be simultaneously enabled) under control of the controller and/or the NFC circuit 50. The concurrent operations may be related to a same operation of the host device or may be performed independently from one another, e.g., may corresponds to different and unrelated operations, circuits, or applications being performed on the host device.

Figure 3:
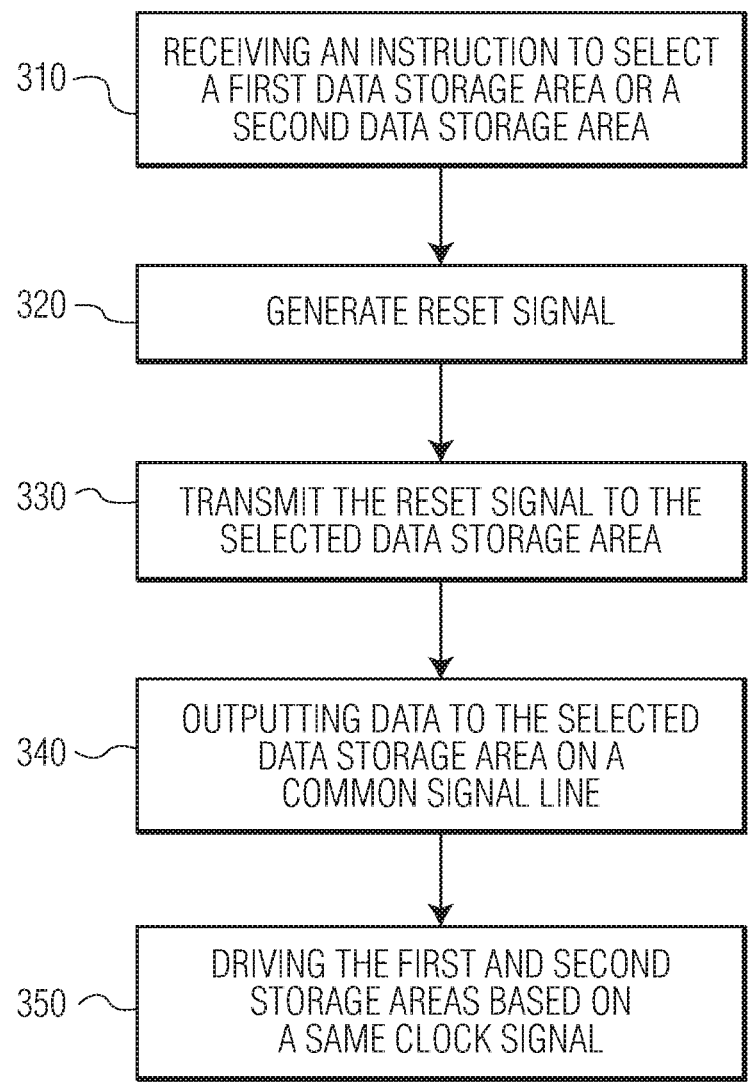
FIG. 3 illustrates an embodiment of a method for managing data storage in a device.

FIG. 3 illustrates an embodiment of a method for managing a plurality of storage areas in a host device. The method may be implemented, for example, by the system of FIG. 1 or by another system. For illustrative purposes, it will be assumed in the following discussion that the system of FIG. 1 is used to implement the method.

Referring to FIG. 3, the method includes, at 310, receiving an instruction to select a first data storage area or a second data storage area in a host device. The first data storage area may be a removable SIM card (e.g., UICC 20) and the second storage area may be embedded storage (e.g., eUICC 30). As previously indicated, the embedded storage area may be integrated on a chip with one or more other circuits, e.g., NFC circuit. The controller of the host device may receive the instruction, for example, from firmware stored in an internal memory or based on a user input (e.g., menu selection or other manual designation).

At 320, the controller generates a reset signal to select the first data storage area or the second data storage area based on the instruction. At this time, the controller may also be configured, based on the received instruction or another instruction, to set one or more applications (or operation of the entire host device) for use with the selected application. The instruction used to set operation of the host device may be generated by the firmware or based on a user input (e.g., menu selection).

At 330, the controller outputs the reset signal to the signal line connected to the reset pin of the selected storage area. For example, in the system of FIG. 1, the controller 10 may output the reset signal on line 110 if the UICC 20 is selected and may output the reset signal to line 140 if the eUICC is selected. Because different reset signal lines are used in this embodiment, the UICC and eUICC may be separately and independently selected to satisfy the data management operations of one or more intended applications.

Additional operations of the method may include, at 340, outputting data to the selected storage area or receiving data from the selected storage area along an input/output signal line commonly connected to the controller of the host device, an I/O pin of the first data storage area (e.g., UICC), and an I/O pin (e.g., eUICC) of the second data storage area. Using a single signal line for this purpose may significantly reduce size, cost, and power consumption.

Another operation of the method may include, at 350, driving the first and second storage areas (when selected or otherwise activated) using the same clock signal. The same clock signal may be output from the controller of the host device along a signal line that is commonly connected to respective clock pins of the data storage devices (e.g., UICC and eUICC). Using a single signal line for this purpose significantly reduces size, cost, and power consumption.

In accordance with one embodiment, a non-transitory machine-readable medium stores instructions to cause a processor to perform the operations of the system and method embodiments described herein. For example, the instructions may cause the processor to select a first storage area or a second storage area, generate a reset signal, and transmit the reset signal to a first signal line coupled to the first storage area or a second signal line coupled to the second storage area. The first storage area may be a removable data storage card (e.g., SIM or UICC) and the second storage area is an embedded data storage area (e.g., eUICC), both of which may be located in a same host device. The processor may be controller 10 which performs operations as described herein.

The controller, processor, and other signal-generating and signal-processing features of the embodiments disclosed herein may be implemented in logic which, for example, may include hardware, software, or both. When implemented at least partially in hardware, the controller, processor, and other signal-generating and signal-processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controller, processor, and other signal-generating and signal-processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. A device, comprising:
    a first signal line coupled to a first storage area;
    a second signal line coupled to a second storage area;

a controller configured to output a signal to the first signal line or the second signal line to select the first storage area or the second storage area, wherein the first storage area is a removable data storage card and the second storage area is an embedded storage area in the device and wherein the signal is a reset signal for the selected one of the first storage area and the second storage area; and a third signal line to carry a clock signal from the controller to the removable data storage card and to the embedded storage area.

2. The device of claim 1, wherein:
the removable data storage card is a universal integrated circuit card (UICC), and
the embedded storage area is an embedded universal integrated circuit card (eUICC).

3. The device of claim 2, further comprising:
a circuit on a chip,
wherein the eUICC is on the chip and the chip is coupled to the UICC.

4. The device of claim 3, wherein the circuit is a near-field communications (NFC) circuit which reads data from or stores data to the selected one of the UICC and the eUICC.

5. The device of claim 4, further comprising:
a single wire protocol (SWP) line coupled between the chip and the UICC,
wherein the NFC circuit communicates with the UICC through the SWP line when the UICC is selected.

6. The device of claim 1, further comprising:
a third signal line coupled to the controller, the removable data storage card, and the embedded storage area, wherein the third signal line is a bidirectional input/output line to carry data.

7. The device of claim 1, wherein the controller is configured to output signals to the first signal line and the second signal line independently from one another.

8. The device of claim 1, wherein the controller is configured to automatically output the signal to the first signal line or the second signal line based on an instruction stored in a memory.

9. The device of claim 1, wherein the controller is configured to output the signal to the first signal line or the second signal line based on a user input signal.

10. A method for managing data storage, comprising:
receiving an instruction to select a first storage area or a second storage area;
generating a reset signal; and
transmitting the reset signal to a first signal line coupled to the first storage area or a second signal line coupled to the second storage area, wherein the first storage area is a removable data storage card and the second storage area is an embedded data storage area and wherein the removable data storage card and the embedded data storage are located in a same device; and transmitting a clock signal along a third signal line commonly coupled to a controller, the removable data storage card, and the embedded storage area.

11. The method of claim 10, wherein:
the removable data storage card is a universal integrated circuit card (UICC), and
the embedded storage area is an embedded universal integrated circuit card (eUICC).

12. The method of claim 11, wherein the eUICC is on a same chip as a circuit.

13. The method of claim 12, wherein the circuit is a near-field communications (NFC) circuit which reads data from or stores data to the selected one of the UICC and the eUICC.

14. The method of claim 10, further comprising:
transmitting data along a third signal line commonly coupled to the controller, the removable data storage card, and the embedded storage area.

15. A non-transitory machine-readable medium storing instructions to cause a processor to:
receive an instruction to select a first storage area or a second storage area;
generate a reset signal; and
transmit the reset signal to a first signal line coupled to the first storage area or a second signal line coupled to the second storage area, wherein the first storage area is a removable data storage card and the second storage area is an embedded data storage area and wherein the removable data storage card and the embedded data storage are located in a same device; and
transmit a clock signal along a third signal line commonly coupled to a controller, the removable data storage card, and the embedded storage area.

16. The medium of claim 15, wherein:
the removable data storage card is a universal integrated circuit card (UICC), and
the embedded storage area is an embedded universal integrated circuit card (eUICC).

17. The medium of claim 16, wherein the eUICC is on a same chip as a circuit.

18. The medium of claim 17, wherein the circuit is a near-field communications (NFC) circuit which reads data from or stores data to the selected one of the UICC and the eUICC.

* * * * *